United States Patent [19]

Hiatt et al.

[11] Patent Number: 4,731,702
[45] Date of Patent: Mar. 15, 1988

[54] COMMUNICATION EQUIPMENT CABINET ARRANGEMENT

[75] Inventors: Jeffrey M. Hiatt, Monmouth Beach; William H. Martin, Jr., Holmdel; Mark E. Millman, Keyport, all of N.J.

[73] Assignees: American Telephone and Telegraph Company, New York, N.Y.; AT&T Information Systems Inc., Morristown, N.J.

[21] Appl. No.: 925,080

[22] Filed: Oct. 30, 1986

[51] Int. Cl.[4] .............................................. H05K 5/04
[52] U.S. Cl. ...................................... 361/391; 361/395; 361/399
[58] Field of Search .............................. 361/383–384, 361/390–399

[56] References Cited

U.S. PATENT DOCUMENTS 4,251,853  2/1981  Sites ..................................... 361/393
4,502,047  2/1985  Fujiwara et al. ..................... 361/390

Primary Examiner—A. D. Pellinen
Assistant Examiner—Gregory D. Thompson
Attorney, Agent, or Firm—John A. Caccuro

[57] ABSTRACT

A communication system is comprised of two or more circuit pack modules mounted onto a mounting apparatus. Each circuit module includes a plastic housing which holds a circuit board mounted therein. An equipment cabinet is formed by mounting a circuit module at each end of the mounting apparatus and utilizing a surface of each circuit module, respectively, as a side of the cabinet. A top panel of the cabinet mounts to the mounting apparatus and circuit modules and covers the circuit modules and any space therebetween. A front panel mounts to the top panel and circuit modules and serves as the front cover of the cabinet.

7 Claims, 5 Drawing Figures

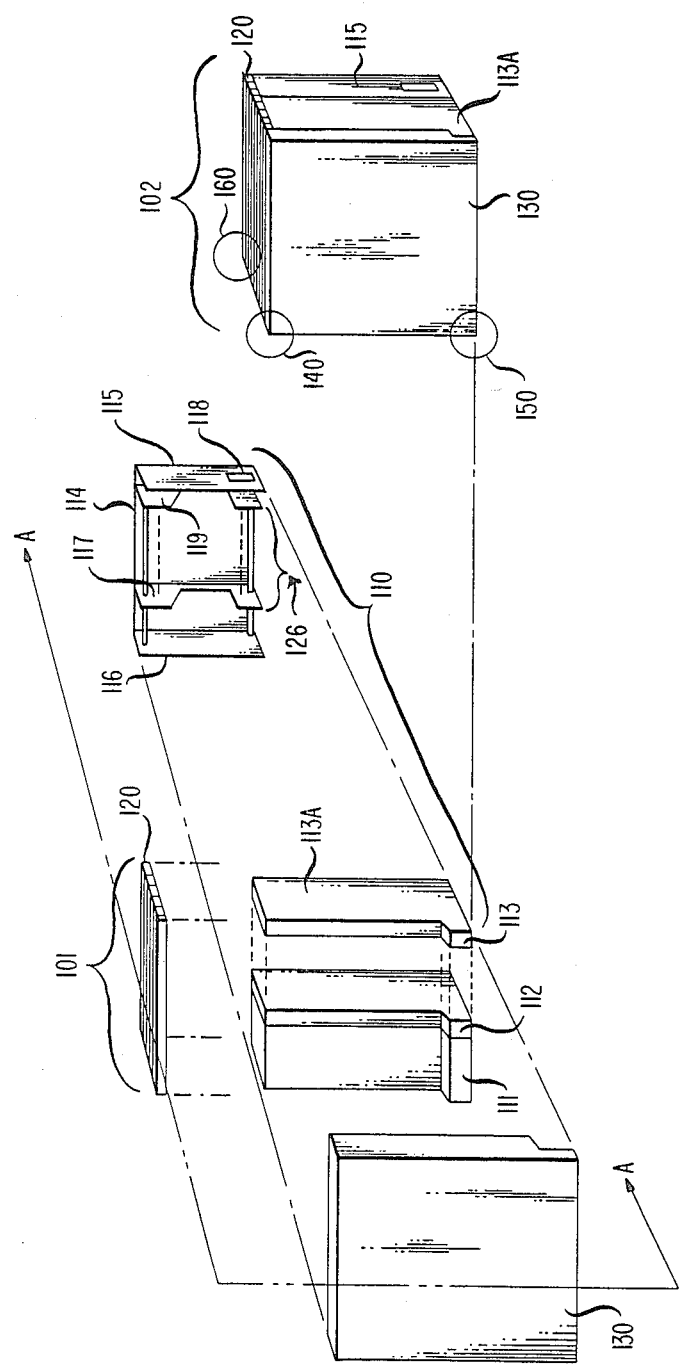

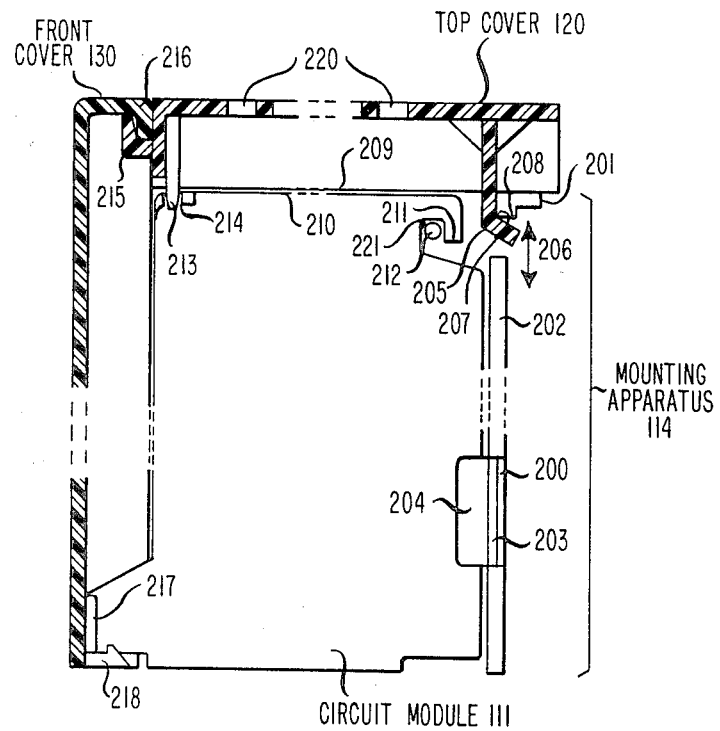
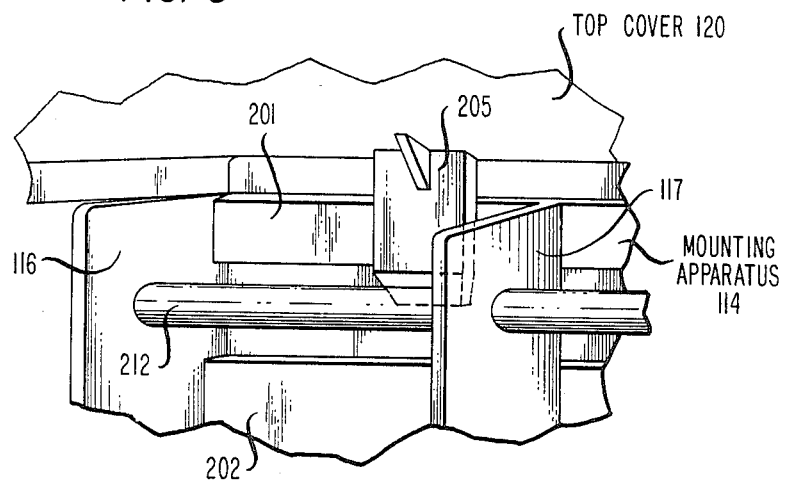

– 4,731,702 –

COMMUNICATION EQUIPMENT CABINET ARRANGEMENT

TECHNICAL FIELD

This invention relates to a communication equipment cabinet which utilizes circuit module housings as the side panels of the cabinet.

BACKGROUND OF THE INVENTION

In prior art communication equipment cabinet design, the cabinets basically consisted of a frame around which sheet metal or plastic surfaces were affixed. In these types of cabinets, there was always a space between the communication equipment which mounted to the cabinet frame and the cabinet walls. This space was often wasted space.

As communication equipment continues to decrease in size, there is a continuing need to eliminate wasted space and to decrease the size of the communication equipment cabinets. Additionally, when the communication circuitry is designed to be modular in size, this imposes additional design problems and complexities on equipment cabinet designs.

SUMMARY OF THE INVENTION

In accordance with the present invention, there is disclosed a communication equipment cabinet which utilizes a surface of a circuit pack housing as a surface of the equipment cabinet. More particularly, the equipment cabinet includes two circuit pack housings mounted at respective ends of a circuit mounting apparatus so that one surface of each circuit pack housing forms a side wall of the equipment cabinet. A top panel of the cabinet covers the circuit pack housings and any intervening spaces therebetween and also mounts onto the backplane unit. A front panel snaps onto the top panel and the circuit pack housings and serves as the front cover of the cabinet. In another embodiment, the top and front panels are formed into one panel.

Because a surface of the circuit pack housing is also utilized as the side panel of the cabinet, there is no wasted space between the cabinet and the circuit pack mounting arrangement. This design also allows for side-to-side mounting of cabinets with no gap between modules. Moreover, since the top and front panels are adjacent to the top and front of the circuit pack housings, little space is wasted thereby.

BRIEF DESCRIPTION OF THE DRAWING

The operation of this invention will become more apparent from the following description taken in conjunction with the accompanying drawings in which:

FIG. 1 shows an exploded view of a communication equipment cabinet in accordance with the present invention;

FIG. 2 shows a cross-section view taken along axis A—A of FIG. 1 to illustrate the connection of the top cover to the mounting apparatus and the connection of the front cover to the top cover and circuit pack modules;

FIG. 3 shows the details of the connection between the left-rear corner of the top cover and the left corner of the mounting apparatus;

DETAILED DESCRIPTION

Figure 4:
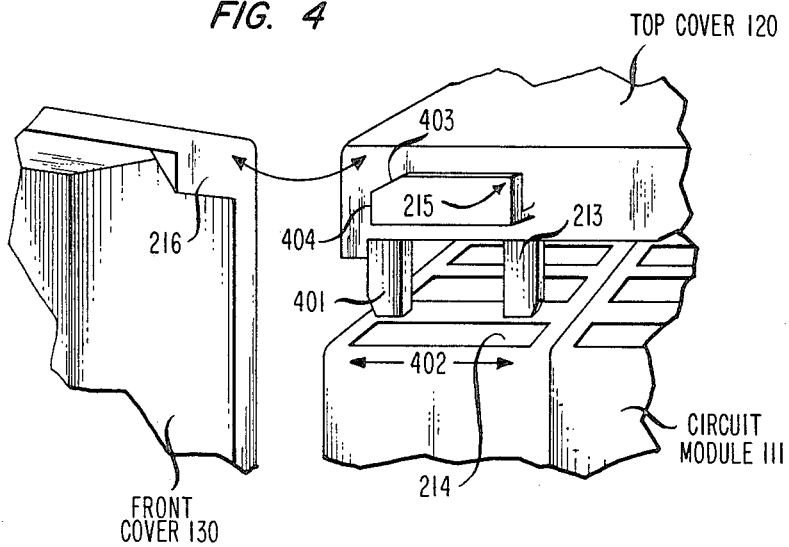
FIG. 4 shows the details of the connection between the front-left corner of the top cover and left-top corner of the front cover.

Shown in FIG. 1 is an exploded view of a communication equipment cabinet 101 and an assembled cabinet 102. The cabinet 101 comprises a circuit pack housing arrangement 110, a top panel 120, and a front panel 130. Circuit pack housing arrangement 110 includes circuit pack housings or modules 111, 112 and 113 mounted to a mounting apparatus 114. One embodiment of such a circuit pack mounting arrangement 110 is disclosed in our concurrently filed, co-pending patent application Ser. No. 925,078, filed Oct. 30, 1986, entitled "A Swing-In Circuit Module Mounting Arrangement" and designated as Hiatt-Martin-Millman, the description of which is incorporated by reference herein.

According to the present invention, the right-side surface 113A of circuit pack module 113 comprises a substantial part of the right-side of cabinet 101. This aspect is better illustrated by 113A of cabinet 102. The left-side surface (not shown) of circuit pack module 111 comprises a substantial part of the left side of cabinet 101. The end partitions 115 and 116, which are part of the mounting apparatus 114, also form part of the right side and left side, respectively, of cabinet 101. A fully assembled cabinet 102 appears as shown with top cover 120, front cover 130, circuit module 113 and mounting apparatus 114.

While the detailed assembly of a typical cabinet will be described in later paragraphs, the general sequence for assembling cabinet 101 is as follows. Circuit modules 111, 112, and 113 are installed on mounting apparatus 114. Top cover 120 is then hooked or connected onto mounting apparatus 114 and then rotated until it rests on circuit modules 111, 112 and 113. Front cover 130 is then hooked onto top cover 120 and rotated until it is flat against the front of circuit modules 111, 112 and 113. The bottom of front cover 130 is then connected at each end to circuit modules 111 and 113.

In communication systems where only two circuit pack modules are required by the system, each module may be placed at respective locations at each end of circuit pack mounting arrangement 110 (i.e., 111 and 113). Alternatively, the two circuit pack modules could be located as shown by 111 and 112 and circuit pack module 113 may be implemented using a dummy module. The dummy modules would not contain any circuitry and would serve only as the right side panel of cabinet 101. When additional circuitry is required in the system, additional circuit pack modules are added to mounting apparatus 114 in the slots 126 located between modules 112 and 113.

If additional circuitry were required, another cabinet (e.g., 102) may be added to the system. Connector 118 on mounting apparatus 114 of cabinet 101 provides for an electrical connection between cabinet 101 and adjacent cabinet 102 via a mating connector thereon (not shown).

FIG. 2 illustrates how top cover 120 mounts to mounting apparatus 114 and how front cover 130 mounts to top cover 120 and the circuit modules. Ventilation holes 220 in top cover 120 provide for air circulation for the circuit modules.

FIG. 3 shows the details of the connection between the left-rear corner (e.g., 160 of FIG. 1) of top cover 120 and the left corner of mounting apparatus 114. The view shown in FIG. 3 is a bottom-rear-left perspective view. To more clearly be able to see the connection between top cover 120 and mounting apparatus 114, circuit module 111 has been omitted from FIG. 3.

In the following description, elements of the disclosure are uniquely numbered, the first digit of which identifies the figure in which the element was first referenced. Thus, for example, element 205 is first referenced in FIG. 2.

With joint reference to FIGS. 1, 2 and 3, the mechanical connection between top cover 120 and mounting apparatus 114 is described. Mounting apparatus 114 includes a top rail 201 and a lower section 202. The lower section may include a connector board 200 onto which is mounted electrical connectors (e.g., 203) for each mounting slot. These connectors mate with electrical connectors (e.g., 204) on circuit pack modules (e.g., 111).

Along the edge of top cover 120 there exist two or more post-like connection means (e.g., 205). Connection means 205 in one embodiment is an angle bracket affixed to top cover 120. Angle bracket 205 is arranged to fit into opening 206 located between top rail 201 and lower section 202 of mounting apparatus 114. When top cover 120 is in its final mounted position, as shown, edge 207 of angle bracket 205 makes contact with edge 208 of top rail 201. In this final position, edge 209 of top cover 120 rests on top of edge 210 of circuit module 111. When in the final position, angle bracket 205 prevents that end of top cover 120 from being lifted vertically away from mounting apparatus 114. Angle bracket 205 also prevents rearward movement of top cover 120 relative to mounting apparatus 114. Side-to-side movement of top cover 120 is prevented because angle bracket 205 abuts against partition 117 of FIG. 1 and another angle bracket located on the right-rear side of top cover 120 (not shown) abuts against partition 119 of FIG. 1. In another embodiment (not shown), angle bracket 205 is made as wide as the separation 202 between partitions 116 and 117.

As described in our previously referenced co-pending application, each circuit module may be mounted to horizontal mounting bar 212 of mounting apparatus 114 using a hook-shaped appendage 211. Obviously, the present invention contemplates that other circuit-module-to-mounting-apparatus connection arrangements may be utilized without affecting the function or operation of the present invention.

FIG. 4 shows the details of the connection between the front-left corner (e.g., 140 of FIG. 1) of top cover 120 and the left-top corner of front cover 130. This connection arrangement also exists on the front-right corner of top cover 120. The view shown by FIG. 4 is a top-front-right perspective view. To better show the details, front cover 130 is shown at a different perspective view and rotated clockwise at an obtuse angle to the front of circuit module 111. The posts 213 and 401 have a separation which is less than length 402 of opening 214. These posts prevent both lateral and rearward movement of top cover 120 relative to circuit module 111. Rearward movement of circuit module 111 relative to mounting apparatus 114 is prevented by edge 221 of circuit module 114 abutting against mounting bar 212. Obviously, other holding or connecting means can be utilized to mount the top cover 120 to the circuit module 111 and/or mounting apparatus 114.

Angle bracket 215 is located on the left side of top cover 120 and a similar second angle bracket (not shown) is located on the right side of top cover 120. Lip 216 is located in the top-right corner of front cover 130, as it is viewed in FIG. 4, and a second lip (not shown) is located in the top-left corner thereof. Lip 216 is made to hook onto or mate with angle bracket 215 and, correspondingly, the second lip with the second angle bracket, so that front cover 130 can hang from top cover 120. Obviously, other hinged, pivotal or other type connection arrangements could be utilized to enable front cover 130 to mount to top cover 120 and/or circuit module 111 and such arrangements are considered to be within the teachings of the present invention. Once front cover 130 is hooked onto top cover 120, it is rotated until it rests against the front surface of cable harness appendage 217 of the circuit module 111.

The tapered edge 403 of angle bracket 215 and a similar tapered edge of the second angle bracket (not shown) at the other side of top cover 120 help laterally align front cover 130 with top cover 120. Edge 404 of angle bracket 215 and a similar edge of the second angle bracket of top cover 120 prevent lateral movement of front cover 130 relative to top cover 120 once it is mounted.

Figure 5:
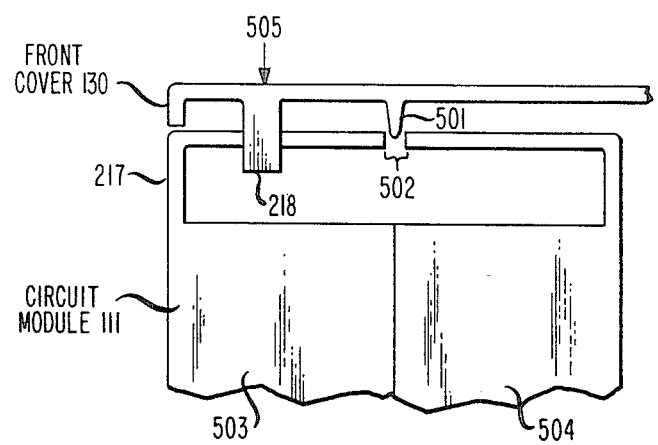
FIG. 5 shows the details of the connection between the left-bottom corner of the front cover and the bottom of a circuit pack module.

FIG. 5 shows a bottom view of the details of the connection between the left-bottom corner (e.g., 150 of FIG. 1) of front cover 130 and the bottom of circuit module 111. The latching of front cover 130 to the circuit modules is described with joint reference to FIGS. 2 and 5. Once front cover 130 is mounted to top cover 120, it is lying against the front of the cable harness appendage 217 of circuit module 111. Latching occurs when the bottom of front cover 130 is pressed in direction 505, causing latching mechanism 218 to deflect and lock behind appendage 217 of circuit module 111. Lateral motion of the front cover 130 relative to circuit module 111 is minimized since post 501 engages the sides of opening 502 in appendage 217 of circuit module 111. Obviously, other holding or mounting techniques can be utilized. In one embodiment, circuit module is comprised of molded halves 503 and 504 and the opening 502 occurs at the mating edge or seam. Opening 502 may also serve as the means for enabling cables to enter cable harness appendage 217.

In one embodiment of the present invention, mounting apparatus 114, circuit module housings 111, 112 and 113, top cover 120 and front cover 130 are constructed by forming plastic into the desired shape and rigidity. Obviously, these component parts and the interconnecting means therebetween can be constructed using other well-known techniques applied to metal or other materials without deviating from the scope of the present invention.

Thus, what has been described is merely indicative of one embodiment of the principles of the present invention. Other methods, techniques or apparatuses can be used by those skilled in the art to implement the present invention without departing from the spirit and scope of the present invention.

What is claimed is:

1. A communication equipment cabinet arrangement comprising
a mounting apparatus having a backplane including at least three parallel mounting slots, each slot arranged for mounting a circuit module therein;
two circuit modules, each module individually mounted in one of two end slots of said mounting apparatus and wherein one side surface of each of said two modules forms a side panel of said cabinet arrangement; and cover means having multiple integral connection means (illustratively, 205, 213, 218) thereon connecting to said two modules and said mounting apparatus, said cover means covering the top and front surfaces of and any intervening spaces between said two modules, thereby forming the top and front panel of said cabinet arrangement.

2. The cabinet arrangement of claim 1 wherein said cover means includes a top cover covering the top surfaces of and any intervening spaces between said two circuit modules and having multiple integral connection means (illustratively, 205, 213, 215) thereon connecting to said two modules, said mounting apparatus and a front cover, and said front cover covering the front surfaces of and any intervening spaces between said circuit modules and having multiple integral mounting means (218, 216) mounting to said two modules and said top cover.

3. The cabinet arrangement of claim 2 wherein one of said multiple integral connection means (205) of said top cover laterally fixes said top cover to said mounting apparatus.

4. The cabinet arrangement of claim 2 wherein one of said multiple integral mounting means (218) of said front cover laterally fixes said front cover to said two modules.

5. The cabinet arrangement of claim 2 wherein said mounting apparatus includes vertically mounted end partitions which form part of the side panels of said cabinet arrangement.

6. The cabinet arrangement of claim 2 wherein said mounting apparatus forms the rear surface of said cabinet arrangement.

7. The cabinet arrangement of claim 2 wherein the multiple integral connection means of said top cover and the multiple integral mounting means of said front cover function to align said top cover and front cover to said two modules, mounting apparatus and each other.

* * * * *